(12) United States Patent
Okaguchi

(10) Patent No.: US 9,711,706 B2
(45) Date of Patent: Jul. 18, 2017

(54) PIEZOELECTRIC ELEMENT DRIVE CIRCUIT

(71) Applicant: Murata Manufacturing Co., Ltd., Nagaokakyo-shi, Kyoto-fu (JP)

(72) Inventor: Kenjiro Okaguchi, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 631 days.

(21) Appl. No.: 14/296,587

(22) Filed: Jun. 5, 2014

(65) Prior Publication Data

US 2014/0285065 A1    Sep. 25, 2014

Related U.S. Application Data

(63) Continuation of application No. PCT/JP2012/080006, filed on Nov. 20, 2012.

(30) Foreign Application Priority Data

Dec. 9, 2011   (JP) ................ 2011-269747

(51) Int. Cl.
*H01L 41/08* (2006.01)
*H01L 41/04* (2006.01)
(52) U.S. Cl.
CPC .................. *H01L 41/042* (2013.01)
(58) Field of Classification Search
CPC .................................... H01L 41/042
(Continued)

(56) References Cited

U.S. PATENT DOCUMENTS 8,314,531 B2 * 11/2012 Sunaga ............... H01L 41/042
                                                                310/317
9,350,278 B1 *  5/2016 Schwab ............... H02P 6/006
(Continued)

FOREIGN PATENT DOCUMENTS

JP    2008-089308 A    4/2008
JP    2008-544388 A   12/2008
(Continued)

OTHER PUBLICATIONS

Official Communication issued in International Patent Application No. PCT/JP2012/080006, mailed on Dec. 18, 2012.

*Primary Examiner* — Thomas Dougherty
(74) *Attorney, Agent, or Firm* — Keating & Bennett, LLP

(57) ABSTRACT

A piezoelectric element drive circuit includes an H bridge circuit, an LPF-attached differential amplifier circuit, an amplifier circuit, and an inverter circuit. First and second drive signals output from the H bridge circuit and having opposite phases are applied to a piezoelectric element. A voltage between opposite ends of a resistor connected to a first output terminal of the H bridge circuit is input to the LPF-attached differential amplifier circuit. A differential signal output from the LPF-attached differential amplifier circuit has a lower slew rate because harmonic components are suppressed by the function of a low pass filter. Accordingly, respective slew rates of first and second control signals input to first and second input terminals of the H bridge circuit are also reduced. Hence the first and second control signals are each provided as a signal having a step-like waveform and including harmonic components that have been suppressed.

13 Claims, 4 Drawing Sheets

(58) Field of Classification Search
USPC .......................................................... 310/317
See application file for complete search history.

(56) References Cited

U.S. PATENT DOCUMENTS

| | | | |
|---|---|---|---|
| 2007/0019308 A1* | 1/2007 | Tomita | G02B 7/023 |
| | | | 359/824 |
| 2008/0198023 A1 | 8/2008 | Hansen | |
| 2009/0134821 A1 | 5/2009 | Ito et al. | |
| 2009/0295455 A1* | 12/2009 | Goodchild | B06B 1/0253 |
| | | | 327/424 |
| 2011/0068657 A1* | 3/2011 | Sunaga | H01L 41/042 |
| | | | 310/316.01 |
| 2012/0200233 A1* | 8/2012 | Pauritsch | H05B 41/2827 |
| | | | 315/279 |
| 2012/0212099 A1* | 8/2012 | Tajima | H01L 41/042 |
| | | | 310/317 |

FOREIGN PATENT DOCUMENTS

| JP | 2009-131105 A | 6/2009 |
|---|---|---|
| JP | 2011-167017 A | 8/2011 |

\* cited by examiner

Preferred Embodiment

DRIVE VOLTAGE FOR
PIEZOELECTRIC
ELEMENT

PIEZOELECTRIC ELEMENT DRIVE CIRCUIT

BACKGROUND OF THE INVENTION

1. Field of the Invention

The present invention relates to a piezoelectric element drive circuit configured to apply to a piezoelectric element two drive signals with opposite phases.

2. Description of the Related Art

Various types of drive circuits for generating drive signals applied to piezoelectric elements have been designed. For instance, Japanese Unexamined Patent Application Publication No. 2008-89308 discloses a drive circuit for generating drive signals, which drive a piezoelectric element at a resonance frequency thereof, by employing a positive feedback loop.

Apart from Japanese Unexamined Patent Application Publication No. 2008-89308, an H bridge circuit has also been practiced as a circuit for supplying two drive signals, having reversed phases, to a load, for example, a motor. The H bridge circuit has the merit that because the drive signals having a voltage equal to twice a source voltage is obtained, the drive voltage can be increased while power consumption is low. Accordingly, when a piezoelectric element is driven with a low-voltage power source, e.g., a cell, it is effective to assemble the H bridge circuit in the self-excited drive circuit disclosed in Japanese Unexamined Patent Application Publication No. 2008-89308, and to supply drive signals to the piezoelectric element from two output terminals of the H bridge circuit.

However, because the H bridge circuit is a switch control circuit, the drive signals output from the H bridge circuit are each a rectangular wave. Furthermore, because the drive signals output from the H bridge circuit are each a rectangular wave and the drive circuit is a self-excited circuit, a control signal input to the H bridge circuit again through feedback is also a rectangular wave. Stated in another way, in this type of drive circuit, a signal transmitted through a feedback loop is a rectangular wave, and a drive waveform applied to the piezoelectric element is constantly a rectangular wave as a matter of course.

Here, the rectangular wave has a waveform with a sharp voltage change rate (hereinafter referred to as a "slew rate") per unit time, and it has not only a frequency component at the resonance frequency of the piezoelectric element, but also frequency components over a very wide range. In other words, the rectangular wave includes not only the frequency component that contributes to substantial operation of the piezoelectric element, but also the frequency components, such as harmonics of the resonance frequency of the piezoelectric element, which do not contribute to the substantial operation and which just consume electric power by merely causing resonance.

It is, therefore, not easy to effectively reduce the power consumption just by combining the self-excited drive circuit and the H bridge circuit with each other.

SUMMARY OF THE INVENTION

Accordingly, preferred embodiments of the present invention provide a piezoelectric element drive circuit that is operated at low power consumption while ensuring a high drive voltage for a piezoelectric element.

According to a preferred embodiment of the present invention, a piezoelectric element drive circuit configured to apply to a piezoelectric element two drive signals having opposite phases includes an H bridge circuit, a current detection resistance, a differential amplifier circuit, and an inverter circuit. The H bridge circuit includes a first input terminal, a second input terminal, a first output terminal, and a second output terminal, the first output terminal and the second output terminal being connected to the piezoelectric element. The current detection resistance is connected between the piezoelectric element and the first output terminal. The differential amplifier circuit receives, as an input, a voltage between opposite ends of the current detection resistance. The inverter circuit is connected to an output terminal of the differential amplifier circuit. An input terminal of the inverter circuit is connected to the first input terminal, and an output terminal of the inverter circuit is connected to the second input terminal. The differential amplifier circuit includes a slew rate reducing circuit.

With the features described above, a self-excited drive circuit is provided. In the case of utilizing the piezoelectric element in, e.g., a piezoelectric pump, therefore, even when the resonance frequency of the piezoelectric element varies with environmental change in the surroundings, the piezoelectric pump is driven with good efficiency at a frequency at which the displacement of the piezoelectric pump is significantly increased or maximized. Furthermore, since the differential amplifier circuit includes the slew rate reducing circuit, rising and falling characteristics of control signals input to the H bridge circuit after being fed back are moderated. Thus, the drive signals of the piezoelectric element preferably have a step-like wave instead of a rectangular wave, and rising and falling characteristics of the drive signals are also moderated. It is hence possible to suppress or eliminate frequency components, which do not contribute to operation of the piezoelectric element (i.e., unnecessary frequency components), from being applied to the piezoelectric element. Accordingly, the piezoelectric element drive circuit is operated at low power consumption while a high drive voltage for the piezoelectric element is ensured. As a result, when the piezoelectric element is driven with an electric cell, the lifetime of the cell is significantly prolonged.

In the piezoelectric element drive circuit according to a preferred embodiment of the present invention, preferably, the slew rate reducing circuit is a low pass filter circuit.

With the feature described above, since the slew rate reducing circuit is the low pass filter, the slew rates of the control signals input to the H bridge circuit are reduced by a comparatively simple circuit configuration.

Preferably, the piezoelectric element drive circuit according to a preferred embodiment of the present invention further includes an amplifier circuit including a band pass filter function and connected between the output terminal of the differential amplifier circuit and the input terminal of the inverter circuit.

With the feature described above, the slew rates of the control signals input to the H-bridge are reduced by a comparatively simple circuit configuration. As a result, power consumption is significantly reduced or minimized.

In the piezoelectric element drive circuit according to a preferred embodiment of the present invention, preferably, an input voltage of the H bridge circuit is set to a value at which FETs constituting the H bridge circuit operate in an unsaturated region.

With the feature described above, slopes of waveforms of the drive signals output from the H bridge circuit are moderated. Therefore, unnecessary frequency components of the drive signals are further suppressed or eliminated. As a result, the power consumption is further reduced.

According to various preferred embodiments of the present invention, the piezoelectric element drive circuit is operated at low power consumption while a high drive voltage for the piezoelectric element is ensured. As a result, when the piezoelectric element is driven with a cell, the lifetime of the cell is significantly prolonged.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
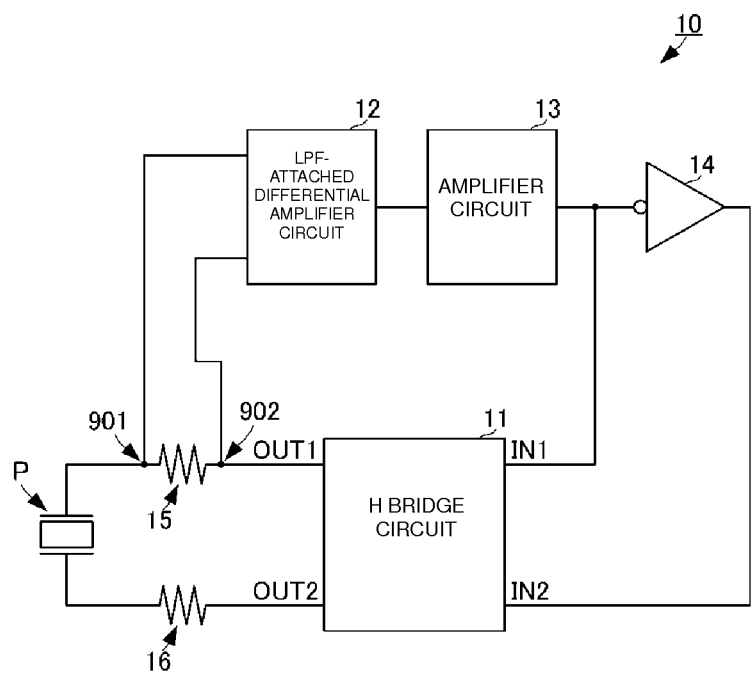
FIG. 1 is a circuit block diagram of a piezoelectric element drive circuit 10 according to a first preferred embodiment of the present invention.

A piezoelectric element drive circuit 10 according to a first preferred embodiment of the present invention will be described below with reference to the drawings. FIG. 1 is a circuit block diagram of the piezoelectric element drive circuit according to the first preferred embodiment of the present invention.

The piezoelectric element drive circuit 10 includes an H bridge circuit 11, an LPF-attached differential amplifier circuit 12, an amplifier circuit 13, an inverter circuit 14, and resistors 15 and 16. The LPF-attached differential amplifier circuit 12 corresponds to a "slew rate reducing circuit". It is to be noted that a piezoelectric element P driven by the piezoelectric element drive circuit 10 of this preferred embodiment is preferably used in a piezoelectric pump, for example. However, the piezoelectric element P can be further used as a piezoelectric element in various types of vibration sensors, such as a piezoelectric gyroscope in which a fundamental wave provides a bending signal and harmonics provide vibrations not contributing to sensing of Coriolis force.

The H bridge circuit 11 preferably includes a plurality of FETs, and includes a first input terminal IN1, a second input terminal IN2, a first output terminal OUT1, and a second output terminal OUT2. The first input terminal IN1 is connected to an input terminal of the inverter circuit 14. The second input terminal IN2 is connected to an output terminal of the inverter circuit 14. The first output terminal OUT1 is connected to a first terminal of the piezoelectric element P. The resistor 15 defining and serving as a current detection resistance is connected between the first output terminal OUT1 and the first terminal of the piezoelectric element P. The second output terminal OUT2 is connected to a second terminal of the piezoelectric element P. The resistor 16 is connected between the second output terminal OUT2 and a second terminal of the piezoelectric element P. The resistors 15 and 16 exhibit the same characteristics (resistance value and so on) such that the first output terminal OUT1 and the second output terminal OUT2 perform driving in a balanced way.

Opposite ends 901 and 902 of the resistor 15 are connected to input terminals of the LPF (Low Pass Filter)-attached differential amplifier circuit 12.

Figure 2:
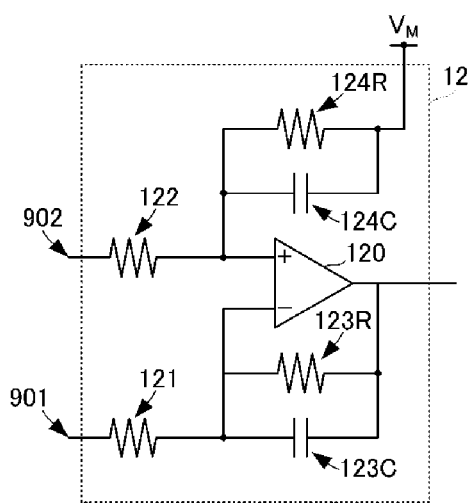
FIG. 2 is a circuit diagram of an LPF-attached differential amplifier circuit 12 according to the first preferred embodiment of the present invention.

FIG. 2 is a circuit diagram of the LPF-attached differential amplifier circuit 12 according to the first preferred embodiment of the present invention. The LPF-attached differential amplifier circuit 12 includes an operational amplifier 120, resistors 121, 122, 123R and 124R, and capacitors 123C and 124C.

An inverting input terminal of the operational amplifier 120 is connected to the first terminal 901 of the resistor 15 through the resistor 121. A non-inverting input terminal of the operational amplifier 120 is connected to the second terminal 902 of the resistor 15 through the resistor 122.

A parallel circuit of the resistor 123R and the capacitor 123C is connected between an output terminal and the inverting input terminal of the operational amplifier 120. A parallel circuit of the resistor 124R and the capacitor 124C is connected to the non-inverting input terminal of the operational amplifier 120. A midpoint potential VM defining and serving as a reference potential is applied to an end portion of the parallel circuit of the resistor 124R and the capacitor 124C on the side opposite to the non-inverting input terminal of the operational amplifier 120.

A pass band and attenuation characteristics of the low pass filter are set by properly setting respective element values of the parallel circuit of the resistor 123R and the capacitor 123C, and respective element values of the parallel circuit of the resistor 124R and the capacitor 124C. The piezoelectric element P exhibits, e.g., bending vibration under resonant driving with input signals. A resonance frequency of the piezoelectric element P preferably is about 25 kHz, for example. The above-mentioned element values are set to provide the pass band and the attenuation characteristics of the low pass filter such that a resonance frequency at which the piezoelectric element P exhibits bending falls within the pass band, and that frequencies of the third-order harmonics of the resonance frequency or higher fall within an attenuation band.

The LPF-attached differential amplifier circuit 12 operates according to the differential between voltages at opposite ends of the resistor 15, which is generated due to a drive current applied to the piezoelectric element P, with the midpoint potential VM serving as the reference potential, and then outputs a differential signal. At that time, since the low pass filter is set as described above, harmonic components of the resonance frequency of the piezoelectric element P are suppressed or eliminated.

The output terminal of the LPF-attached differential amplifier circuit 12 is connected to an input terminal of the amplifier circuit 13. The amplifier circuit 13 amplifies the input differential signal with a predetermined gain and then outputs an amplified signal. This output signal defines and serves as a first control signal.

An output terminal of the amplifier circuit 13 is connected to the input terminal of the inverter circuit 14 and is further connected to the first input terminal IN1 of the H bridge circuit 11. With the arrangement described above, the first control signal is input to the first input terminal IN1 of the H bridge circuit 11.

The inverter circuit 14 inverts the phase of the first control signal without changing the amplitude of the first control signal, and then outputs a resulting signal. This output signal serves as a second control signal having a phase opposite to that of the first control signal. The output terminal of the inverter circuit 14 is connected to the second input terminal IN2 of the H bridge circuit 11, as described above. With the arrangement described above, the second control signal is input to the second input terminal IN2 of the H bridge circuit 11.

With the arrangement described above, a drive signal applied to the piezoelectric element P is fed back and is utilized as the control signals for the H bridge circuit 11. On that occasion, by setting respective element values and characteristics of the individual circuit elements such that the gain of a feedback system is 1 or more at the resonance frequency at which the piezoelectric element P exhibits bending and that the phase angle is 0°, the Barkhausen's oscillation condition is satisfied and the driving of the piezoelectric element P at the resonance frequency is realized.

Figure 3:
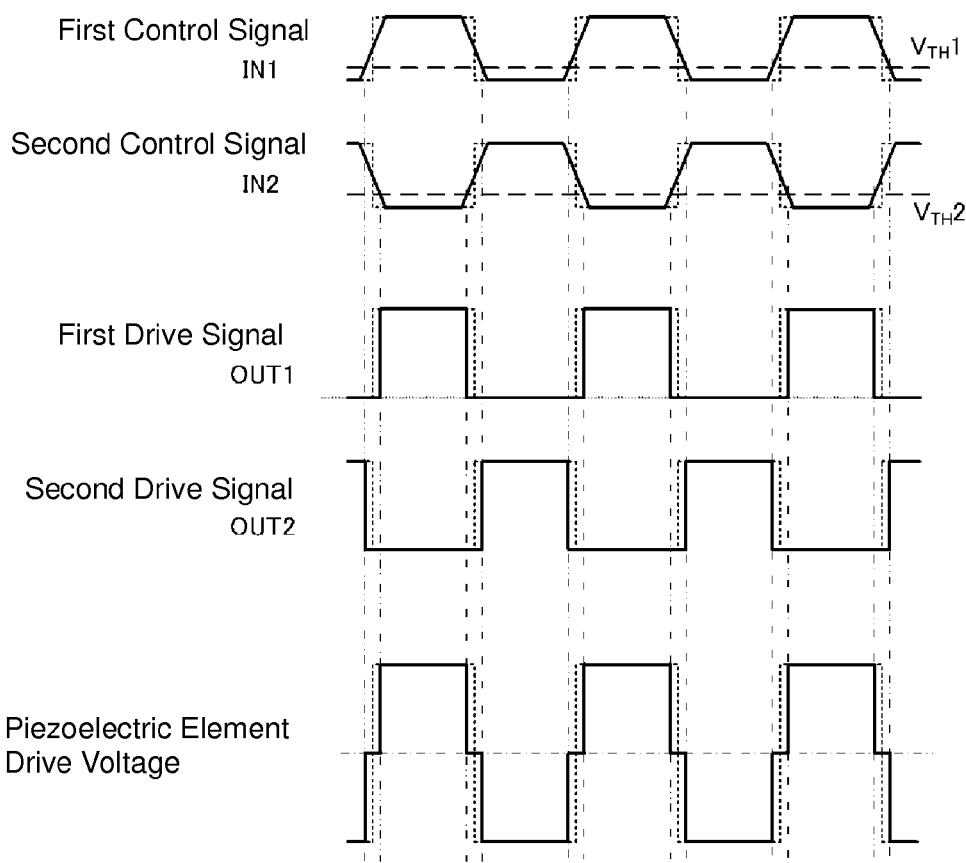
FIG. 3 is a chart illustrating respective waveforms of control signals and drive signals of an H bridge circuit 11, and of a drive voltage for a piezoelectric element.

The piezoelectric element drive circuit 10 having the above-described arrangement operates as follows. FIG. 3 is a chart illustrating respective waveforms of the control signals and drive signals of the H bridge circuit 11, and of a drive voltage for the piezoelectric element. In FIG. 3, broken lines represent waveforms obtained with the related-art arrangement, and solid lines represent waveforms obtained with this preferred embodiment.

Because the piezoelectric element drive circuit 10 satisfies the Barkhausen's oscillation condition as mentioned above, the voltage applied to the piezoelectric element P increases as a current flowing through the piezoelectric element P increases gradually. In the above-described arrangement, when circuit drive voltages are applied from a power supply circuit (not illustrated) to respective amplifiers of the individual amplifier circuits, minute noise on a feedback line is subjected to positive feedback and is continuously amplified until reaching the amplifier's saturation condition. As a result, the first control signal and the second control signal corresponding to the circuit drive voltages are input to the H bridge circuit 11, and first and second drive signals corresponding to the first and second control signals are supplied to the piezoelectric element P.

Here, if the differential amplifier circuit does not include the low pass filter, the first and second drive signals output from the H bridge circuit 11 are rectangular waves, and the fed-back first and second control signals are also rectangular waves, as represented by the broken lines in FIG. 3. Accordingly, the first and second drive signals generated in the next cycle in accordance with those first and second control signals are rectangular waves. Hence, the drive voltage for the piezoelectric element, which is given as the differential between the first and second drive signals, is further in the form of a rectangular wave. This implies that, as described above, the drive voltage for the piezoelectric element includes many frequency components other than the frequency contributing to the bending vibration of the piezoelectric element and power consumption is not sufficiently suppressed.

On the other hand, in the case of employing the arrangement of this preferred embodiment, third- or higher-order harmonic components of the resonance frequency of the piezoelectric element P are suppressed or eliminated by the LPF-attached differential amplifier circuit 12, and respective slew rates of the first and second control signals are reduced as illustrated in FIG. 3. More specifically, rising and falling of the first and second control signals are moderated from steep characteristics. Stated in another way, the first and second control signals are not momentarily changed over in state transition from a Low level (potential) to a Hi level (potential) and in state transition from the Hi level to the Low level, but their state transition occurs gradually from the Low level to the Hi level and from the Hi level to the Low level.

Here, as illustrated in FIG. 3, switching thresholds $V_{TH}1$ and $V_{TH}2$ are set respectively for the first and second control signals at a level close to the Low level. This makes state transition timings of the first control signal and the second control signal different from each other. In other words, the switch changing-over timing by the first control signal and the switch changing-over timing by the second control signal are set to be different from each other.

By thus setting the different switch changing-over timings, state transition timing of the first drive signal and state transition timing of the second drive signal are different from each other as illustrated in FIG. 3. More specifically, a Hi-level period of each of the first and second drive signals becomes shorter than a Low-level period thereof.

With the above-described control, the drive voltage for the piezoelectric element P, which is the differential between the first drive signal and the second drive signal, is provided as a signal oscillating with its voltage transited in step-like way, as illustrated in the lowermost stage of FIG. 3.

Figure 4:
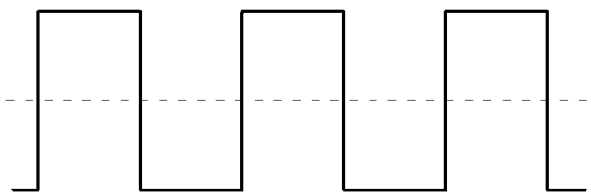
FIG. 4 is a chart illustrating a drive signal waveform in the piezoelectric element drive circuit 10 according to the first preferred embodiment of the present invention, and a drive signal waveform in a piezoelectric element drive circuit of related art.
Figure 4:
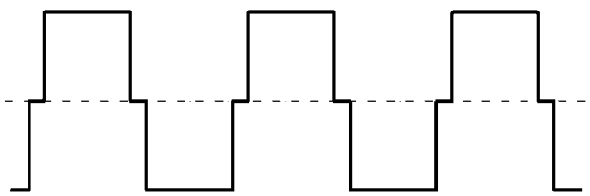

FIG. 4 is a chart illustrating a drive signal waveform in the piezoelectric element drive circuit 10 according to the first preferred embodiment of the present invention, and a drive signal waveform in a piezoelectric element drive circuit of related art. As illustrated in FIG. 4, the drive signal waveform in this preferred embodiment is closer to a sine wave than a rectangular wave representing the drive signal waveform in the related art. This implies that useless harmonic components are suppressed or eliminated.

Thus, the harmonic components applied to the piezoelectric element P are suppressed or eliminated, and the frequency components not contributing to the bending operation of the piezoelectric element P are prevented from being applied to the piezoelectric element P.

When a piezoelectric pump includes the piezoelectric element that is driven in accordance with the above-described driving method, the following advantageous effects are obtained.

Figure 5:
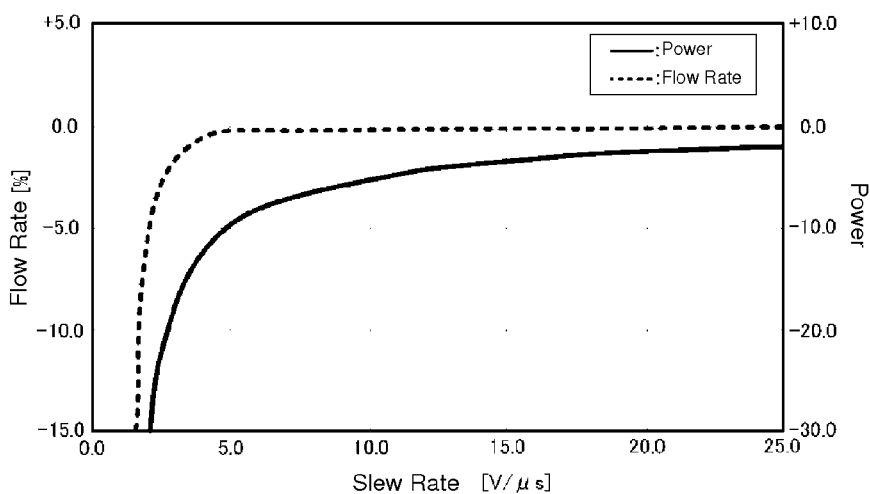
FIG. 5 is a graph plotting change of a flow rate and change of power consumption with respect to a slew rate in a piezoelectric pump using the piezoelectric element, which is driven by the piezoelectric element drive circuit according to the first preferred embodiment of the present invention, and in a piezoelectric pump using a piezoelectric element driven by the drive circuit of related art.

FIG. 5 is a graph plotting change of a flow rate and change of power consumption with respect to a slew rate in a piezoelectric pump using the piezoelectric element, which is driven by the piezoelectric element drive circuit according to the first preferred embodiment of the present invention, and in a piezoelectric pump using a piezoelectric element driven by the drive circuit of related art. As illustrated in FIG. 5, even when the slew rate is reduced, the flow rate is hardly reduced until the slew rate reaches a predetermined value. On the other hand, the power consumption is reduced by reducing the slew rate. By appropriately setting the slew rate, therefore, a piezoelectric pump is realized in which the power consumption is suppressed without reducing the flow rate. For example, when characteristics illustrated in FIG. 5 are obtained, the power consumption is effectively reduced without reducing the flow rate by setting the slew rate to about 5 V/μs, for example.

Figure 6:
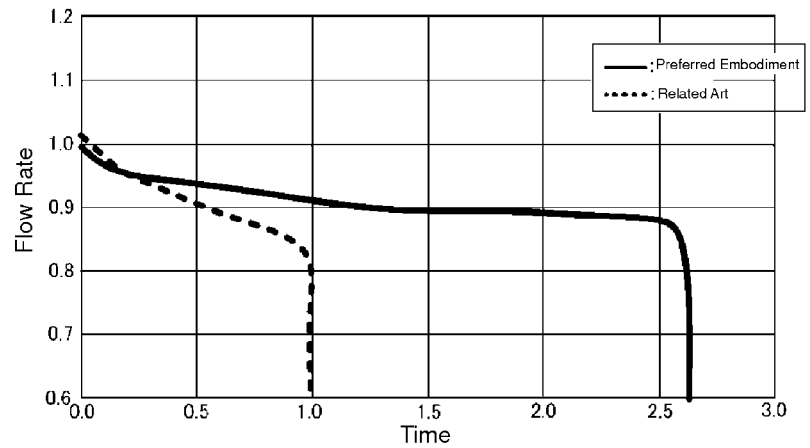
FIG. 6 is a graph plotting change of a flow rate over time in the piezoelectric pump using the piezoelectric element, which is driven by the piezoelectric element drive circuit according to the first preferred embodiment of the present invention, and in the piezoelectric pump using the piezoelectric element driven by the drive circuit of related art.

FIG. 6 is a graph plotting change of a flow rate over time in the piezoelectric pump using the piezoelectric element, which is driven by the piezoelectric element drive circuit according to the first preferred embodiment of the present invention, and in the piezoelectric pump using the piezoelectric element driven by the drive circuit of related art. The result of FIG. 6 represents an example of comparison when both the piezoelectric pumps are driven with cells having the same capacity.

As seen from FIG. 6, the duration time of the cell is prolonged about 2.5 times or longer as a result of comparing the duration time of the cell in the drive circuit of this preferred embodiment with a reference that is the duration time of the cell in the related-art drive circuit. In addition, in comparison with the related art, the drive circuit of this preferred embodiment operates more stably without causing significant reduction of the flow rate.

Thus, by using the piezoelectric element drive circuit of this preferred embodiment, electric power is saved to a larger extent than saved with the related-art drive circuit. In particular, when the piezoelectric element drive circuit is utilized to drive the piezoelectric element in the piezoelectric pump, electric power is greatly saved without significantly reducing the flow rate of the piezoelectric pump.

Figure 7:
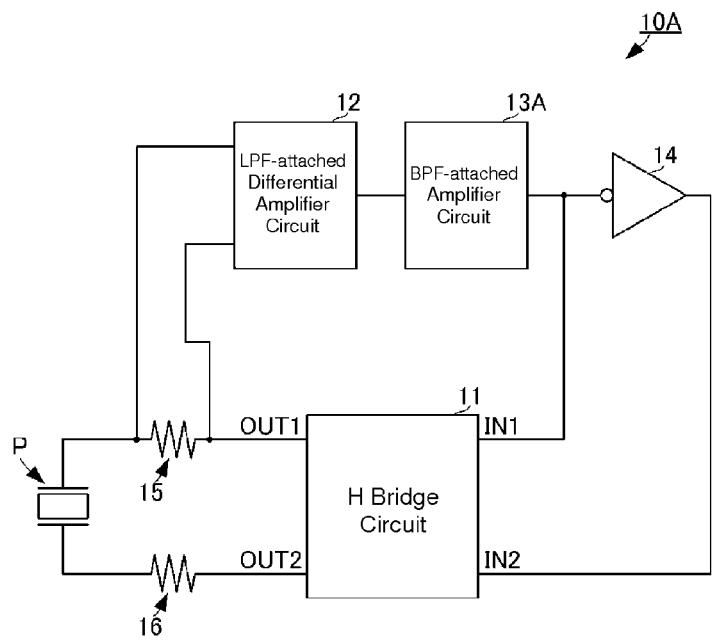
FIG. 7 is a circuit block diagram of a piezoelectric element drive circuit 10A according to a second preferred embodiment of the present invention.

A piezoelectric element drive circuit according to a second preferred embodiment of the present invention will be described below with reference to the drawings. FIG. 7 is a circuit block diagram of a piezoelectric element drive circuit 10A according to the second preferred embodiment of the present invention.

The piezoelectric element drive circuit 10A includes an H bridge circuit 11, an LPF-attached differential amplifier circuit 12, a BPF-attached amplifier circuit 13A, an inverter circuit 14, and resistors 15 and 16.

The piezoelectric element drive circuit 10A according to the second preferred embodiment is different from the piezoelectric element drive circuit 10 according to the first preferred embodiment in including the BPF-attached amplifier circuit 13A instead of the amplifier circuit 13. Because the remaining configuration is the same, the following description is made only about points related to the use of the BPF-attached amplifier circuit 13A.

An input terminal of the BPF-attached amplifier circuit 13A is connected to the output terminal of the LPF-attached differential amplifier circuit 12. An output terminal of the BPF-attached amplifier circuit 13A is connected to the input terminal of the inverter circuit 14 and is further connected to the first input terminal IN1 of the H bridge circuit 11.

Figure 8:
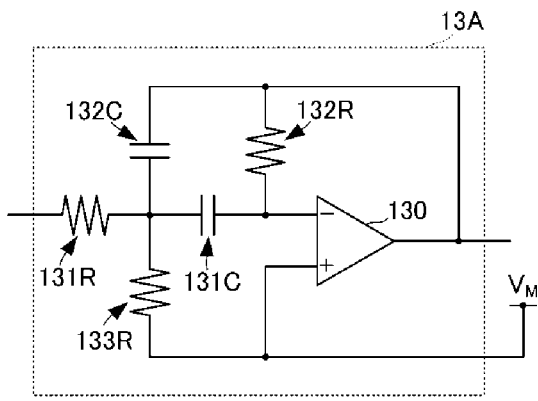
FIG. 8 is a circuit diagram of a BPF-attached differential amplifier circuit 13A according to the second preferred embodiment of the present invention.

FIG. 8 is a circuit diagram of the BPF-attached differential amplifier circuit 13A according to the second preferred embodiment of the present invention. The BPF-attached differential amplifier circuit 13A includes an operational amplifier 130, resistors 131R, 132R and 133R, and capacitors 131C and 132C.

An inverting input terminal of the operational amplifier 130 is connected to the output terminal of the LPF-attached differential amplifier circuit 12 through a serial circuit of the capacitor 131C and the resistor 131R. In that serial circuit, the capacitor 131C is positioned on the side closer to the inverting input terminal, and the resistor 131R is positioned on the side closer to the LPF-attached differential amplifier circuit 12.

An output terminal of the operational amplifier 130 is connected to the inverting input terminal thereof through the resistor 132R. The output terminal of the operational amplifier 130 is further connected to a junction point of the capacitor 131C and the resistor 131R through the capacitor 132C.

A midpoint potential VM is applied to the junction point of the capacitor 131C and the resistor 131R through the resistor 133R. The midpoint potential VM is further applied to the non-inverting input terminal of the operational amplifier 130.

A pass band and attenuation characteristics of the band pass filter are set by properly setting respective element values of the serial circuit of the resistor 131R and the capacitor 131C, and respective element values of the parallel circuit of the resistor 132R and the capacitor 132C. The above-mentioned element values are set such that a resonance frequency at which the piezoelectric element P exhibits bending falls within the pass band, and that other resonance frequencies contributing to bending of the piezoelectric element P in different vibration modes and the second-order harmonics of the resonance frequencies fall within an attenuation band.

With the arrangement described above, it is possible to suppress or eliminate not only those resonance frequencies contributing to bending of the piezoelectric element P in different vibration modes, but also those resonance frequencies that cannot be fully suppressed or eliminated by the LPF-attached differential amplifier circuit 12 and that increase the power consumption without contributing to the bending of the piezoelectric element P. As a result, the power consumption is further reduced.

In the preferred embodiments described above, preferably, respective voltage values of the first and second control signals input to the H bridge circuit 11 are set to values at which the FETs operate in a linear region, i.e., an unsaturated region. Such voltage setting preferably is realized by properly setting the circuit drive voltage applied from the power supply circuit, and the midpoint potential VM that is preferably set by the circuit drive voltage.

Figure 9:
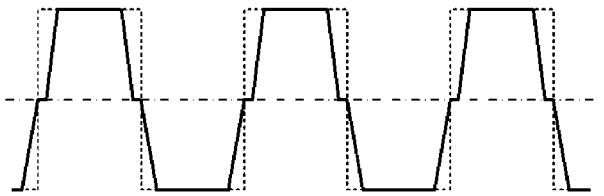
FIG. 9 is a chart illustrating a waveform of a drive voltage for the piezoelectric element.

Thus, a waveform of a drive voltage for the piezoelectric element, illustrated in FIG. 9, is realized. FIG. 9 is a chart illustrating the waveform of the drive voltage for the piezoelectric element when the linear characteristic region of the FETs is utilized. By using the linear characteristic region of the FETs, a voltage change rate over time is reduced as illustrated in FIG. 9 when the voltage is changed in a step-like way. In other words, the slew rate in each step is significantly reduced. Hence, the drive voltage having a waveform even closer to a sine wave is obtained, and the harmonic frequency components are further suppressed or eliminated without reducing the fundamental frequency (i.e., the resonance frequency at which the piezoelectric element exhibits the bending). As a result, the power consumption is further reduced, and a longer lifetime of the cell is obtained.

Regarding the voltage values of the first and second control signals input to the H bridge circuit 11, more preferably, maximum peak voltage values at which the magnitudes of the first and second control signals are maximized in one period are set to values at which the FETs constituting the H bridge circuit 11 operate in a nonlinear region, i.e., a saturated region.

While, in the above-described preferred embodiments, the piezoelectric element P preferably constitutes the piezoelectric pump operated under resonant driving, the present invention is not limited to such a case. For instance, the piezoelectric element may be provided alone. The piezoelectric element is preferably made of, e.g., a PZT-based ceramic, a sodium potassium niobate-based ceramic, an alkali niobate-based ceramic, quartz, lithium tantalate, or lithium niobate. Furthermore, the piezoelectric element may constitute, e.g., various types of vibration sensors, such as a piezoelectric gyroscope in which a fundamental wave provides a bending vibration and harmonics provide vibrations not contributing to sensing of Coriolis force.

While the vibration mode of the piezoelectric element P preferably is the bending vibration mode in the above-described preferred embodiments, the present invention is not limited to such a case. For instance, the piezoelectric element may be driven using the thickness expansion vibration mode.

While the H bridge preferably is constituted by FETs in the above-described preferred embodiments, the present invention is not limited to such a case. For instance, bipolar transistors may be used instead.

Figure 10A:
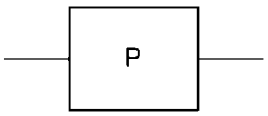
FIGS. 10A-10C illustrate various types of slew rate reducing circuits.
Figure 10B:
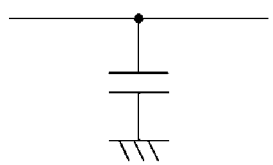
Figure 10C:
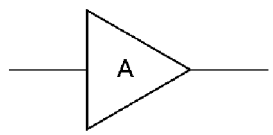

While the slew rate reducing circuit preferably includes the low pass filter in the above-described preferred embodiments, the present invention is not limited to such a case. For instance, the slew rate reducing circuit may be realized by providing a phase circuit or a linear amplifier in a stage downstream of the differential amplifier circuit. Moreover, the low pass filter may be connected in multiple stages. The low pass filter may be in combination of passive elements, such as a capacitor and a resistor, or may be constituted only by a capacitor. FIGS. 10A-10C illustrate various types of slew rate reducing circuits. The slew rate reducing circuit of FIG. 10A is constituted by a phase circuit. The slew rate reducing circuit of FIG. 10B is constituted only by a capacitor connected between a signal line and a ground potential. The slew rate reducing circuit of FIG. 10C is constituted by a linear amplifier having a low slew rate.

Finally, the above description of the preferred embodiments is to be considered in all respects as illustrative and not restrictive. The scope of the present invention is not defined by the above-described preferred embodiments, and it is defined in claims. In addition, the scope of the present invention includes all modifications that are equivalent to or fall within the scope defined in claims.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A piezoelectric element drive circuit configured to apply to a piezoelectric element two drive signals with opposite phases, the piezoelectric element drive circuit comprising:

an H bridge circuit including a first input terminal, a second input terminal, a first output terminal, and a second output terminal, the first output terminal and the second output terminal being connected to the piezoelectric element;

a current detection resistance connected between the piezoelectric element and the first output terminal;

a differential amplifier circuit configured to receive, as an input, a voltage between opposite ends of the current detection resistance; and an inverter circuit connected to an output terminal of the differential amplifier circuit; wherein an input terminal of the inverter circuit is connected to the first input terminal, and an output terminal of the inverter circuit is connected to the second input terminal; and the differential amplifier circuit includes a slew rate reducing circuit.

2. The piezoelectric element drive circuit according to claim 1, wherein the slew rate reducing circuit includes a low pass filter circuit.

3. The piezoelectric element drive circuit according to claim 1, further comprising an amplifier circuit including a band pass filter and connected between the output terminal of the differential amplifier circuit and the input terminal of the inverter circuit.

4. The piezoelectric element drive circuit according to claim 1, wherein an input voltage of the H bridge circuit is set to a value at which FETs constituting the H bridge circuit operate in an unsaturated region.

5. The piezoelectric element drive circuit according to claim 1, wherein the H-bridge circuit includes a plurality of FETs or a plurality of bipolar transistors.

6. The piezoelectric element drive circuit according to claim 1, wherein the differential amplifier circuit includes an operational amplifier, resistors and capacitors.

7. The piezoelectric element drive circuit according to claim 1, wherein the piezoelectric element drive circuit is configured such that a drive signal applied to the piezoelectric element is fed back and used as controls signals for the H-bridge circuit.

8. The piezoelectric element drive circuit according to claim 1, wherein the H-bridge circuit is configured to operate in accordance with Barkhausen's oscillation condition.

9. The piezoelectric element drive circuit according to claim 3, wherein the amplifier circuit includes an operational amplifier, resistors and capacitors.

10. The piezoelectric element drive circuit according to claim 1, wherein the piezoelectric element drive circuit is configured to drive the piezoelectric element in one of a bending vibration mode and a thickness expansion vibration mode.

11. The piezoelectric element drive circuit according to claim 1, wherein the slew rate reducing circuit includes a phase circuit or a linear amplifier.

12. A piezoelectric pump comprising the piezoelectric element drive circuit according to claim 1.

13. A vibration sensor comprising the piezoelectric element drive circuit according to claim 1.

* * * * *